US012796092B2

(12) United States Patent
Zhao et al.

(10) Patent No.: US 12,796,092 B2
(45) Date of Patent: Nov. 10, 2026

(54) ARRAY SUBSTRATE, DISPLAY PANEL, DISPLAY DEVICE, AND METHOD FOR MANUFACTURING ARRAY SUBSTRATE

(71) Applicants: HEFEI BOE DISPLAY TECHNOLOGY CO., LTD., Hefei (CN); BOE TECHNOLOGY GROUP CO., LTD., Beijing (CN)

(72) Inventors: Lixing Zhao, Beijing (CN); Jincheng Gao, Beijing (CN); Tao Wang, Beijing (CN); Liang Chen, Beijing (CN); Zexu Liu, Beijing (CN); Ruifeng Zhang, Beijing (CN); Quanzhou Liu, Beijing (CN); Wentao Lu, Beijing (CN); Xiang Li, Beijing (CN)

(73) Assignees: Hefei BOE Display Technology Co., Ltd., Hefei (CN); Beijing BOE Technology Development Co., Ltd., Beijing (CN)

( * ) Notice: Subject to any disclaimer, the term of this patent is extended or adjusted under 35 U.S.C. 154(b) by 523 days.

(21) Appl. No.: 18/285,012

(22) PCT Filed: Oct. 27, 2022

(86) PCT No.: PCT/CN2022/128009
§ 371 (c)(1),
(2) Date: Sep. 29, 2023

(87) PCT Pub. No.: WO2024/087109
PCT Pub. Date: May 2, 2024

(65) Prior Publication Data
US 2025/0081608 A1 Mar. 6, 2025

(51) Int. Cl.
*H10D 86/60* (2025.01)
*H10D 86/01* (2026.01)
*H10D 86/40* (2025.01)

(52) U.S. Cl.
CPC ........... *H10D 86/60* (2025.01); *H10D 86/021* (2025.01); *H10D 86/441* (2025.01)

(58) Field of Classification Search
CPC ..... H10D 86/60; H10D 86/021; H10D 86/441
See application file for complete search history.

(56) References Cited

U.S. PATENT DOCUMENTS

2015/0325159 A1 11/2015 Li et al.
2016/0252756 A1 9/2016 Fu
2022/0406875 A1* 12/2022 Zhang .................... H10K 30/81

FOREIGN PATENT DOCUMENTS

CN 103149713 A 6/2013
CN 103513454 A 1/2014
(Continued)

*Primary Examiner* — Joseph L Williams
(74) *Attorney, Agent, or Firm* — The Webb Law Firm

(57) ABSTRACT

An array substrate, a display panel, a display device, and a method for manufacturing an array substrate are provided. The array substrate includes an array substrate; a plurality of data signal lines arranged on the base substrate; a plurality of fan-out lines arranged side-by-side on the base substrate and respectively lapped with the plurality of data signal lines through adapter holes; and a first test lead wire arranged on the base substrate, wherein the first test lead wire includes a first test pad, a first lead wire segment, and a second lead wire segment, the first lead wire segment is electrically connected to at least a part of the plurality of fan-out lines and arranged in a same layer as the fan-out lines, and the second lead wire segment is electrically connected to the first test pad and lapped with the first lead wire segment through an adapter hole.

19 Claims, 8 Drawing Sheets

(56) References Cited

FOREIGN PATENT DOCUMENTS

| | | | |
|---|---|---|---|
| CN | 103474418 | B | 5/2016 |
| CN | 102929051 | B | 6/2016 |
| CN | 107861658 | A | 3/2018 |
| CN | 109559644 | A | 4/2019 |
| CN | 210323696 | U | 4/2020 |
| CN | 112310044 | A | 2/2021 |
| CN | 113437086 | A | 9/2021 |

* cited by examiner

ARRAY SUBSTRATE, DISPLAY PANEL, DISPLAY DEVICE, AND METHOD FOR MANUFACTURING ARRAY SUBSTRATE

CROSS-REFERENCE TO RELATED APPLICATION

This application is the United States National Phase of International Application No. PCT/CN2022/128009, filed Oct. 27, 2022, the disclosure of which is hereby incorporated by reference in its entirety.

BACKGROUND OF THE INVENTION

Field of the Invention

The present disclosure relates to the field of display technology, and in particular, to a display substrate, a display panel, a display device, and a method for manufacturing an array substrate.

Description of Related Art

In some related technologies of display panels, an array substrate is a key component in controlling the brightness of pixels. The array substrate includes a pixel area and peripheral metal traces (e.g., GOA, Vcom, CLK, and Fanout). The peripheral metal traces are prepared by a metal patterning process on a gate layer and a SD layer. After the array substrate is completed, an array test process is performed to determine whether there is a driveability defect, so there are test pads corresponding to different signal lines, at the periphery of the array substrate.

SUMMARY OF THE INVENTION

In an aspect of the present disclosure, an array substrate is provided, which includes: a base substrate; a plurality of data signal lines arranged on the base substrate; a plurality of fan-out lines arranged side-by-side on the base substrate and respectively lapped with the plurality of data signal lines through adapter holes; and a first test lead wire arranged on the base substrate, wherein the first test lead wire includes a first test pad, a first lead wire segment, and a second lead wire segment, the first lead wire segment is electrically connected to at least a part of the plurality of fan-out lines and arranged in a same layer as the plurality of fan-out lines, and the second lead wire segment is electrically connected to the first test pad and lapped with the first lead wire segment through an adapter hole.

In some embodiments, the plurality of fan-out lines, and the first lead wire segment and the second lead wire segment are arranged in a same layer and made of a same material.

In some embodiments, the plurality of fan-out lines, the first lead wire segment, and the second lead wire segment are all located in a gate material layer.

In some embodiments, the first lead wire segment is arranged in a different layer from the second lead wire segment.

In some embodiments, the plurality of fan-out lines and the first lead wire segment are both located in a gate material layer and made of a same material, and the second lead wire segment is located in a source-drain material layer.

In some embodiments, the array substrate further includes: a second test lead wire arranged on the base substrate, wherein the second test lead wire includes a second test pad and a lead wire, the first lead wire segment is electrically connected to a part of the plurality of fan-out lines, and the lead wire is lapped with another part of the plurality of fan-out lines through adapter holes and electrically connected to the second test pad.

In some embodiments, the lead wire is arranged in a different layer from the plurality of fan-out lines.

In some embodiments, the plurality of fan-out lines are located in a gate material layer, and the lead wire is located in a source-drain material layer.

In some embodiments, the lead wire includes a third lead wire segment and a fourth lead wire segment, the third lead wire segment is arranged in a different layer from the plurality of fan-out lines and lapped with another part of the plurality of fan-out lines through adapter holes, and the fourth lead wire segment is electrically connected to the second test pad and lapped with the third lead wire segment through an adapter hole.

In some embodiments, the third lead wire segment and the fourth lead wire segment are arranged in a same layer and made of a same material.

In some embodiments, the third lead wire segment and the fourth lead wire segment are both located in a source-drain material layer, and the plurality of fan-out lines are located in a gate material layer.

In some embodiments, the third lead wire segment and the fourth lead wire segment are arranged in different layers.

In some embodiments, the third lead wire segment is located in a source-drain material layer, and the fourth lead wire segment and the plurality of fan-out lines are both located in a gate material layer.

In some embodiments, the array substrate has a display area and a non-display area at least partially surrounding the display area, the non-display area includes a fan-out area and a test lead wire area, the plurality of fan-out lines are at least partially located in the fan-out area, and the first test lead wire is at least partially located in the test lead wire area.

In some embodiments, the adapter hole between the first lead wire segment and the second lead wire segment is located on a side of the second lead wire segment adjacent to the display area.

In some embodiments, the first lead wire segment is lapped with the second lead wire segment at the adapter hole by conducting layers located on a side of a layer where the first lead wire segment is located and a layer where the second lead wire segment is located, which is away from the base substrate.

In some embodiments, the material of the conducting layer includes indium tin oxide.

In some embodiments, a width of an end of at least one of the first lead wire segment and the second lead wire segment for providing the adapter hole is not less than a width of a lead wire segment portion adjacent to the end.

In an aspect of the present disclosure, a display panel is provided, which includes the above-mentioned array substrate.

In an aspect of the present disclosure, a display device is provided, which includes the above-mentioned display panel.

In an aspect of the present disclosure, a manufacturing method of an array substrate is provided, which includes: providing a base substrate; forming a plurality of data signal lines, a plurality of fan-out lines, and a first test lead wire on the base substrate, wherein the first test lead wire includes a first test pad, a first lead wire segment, and a second lead wire segment, the first lead wire segment is electrically connected to at least part of the plurality of fan-out lines and arranged in a same layer as the plurality of fan-out lines, the second lead wire segment is electrically connected to the first test pad, the first lead wire segment is not electrically connected to the second lead wire segment; forming an insulating structure on a side of the plurality of data signal lines, the plurality of fan-out lines, and the first test lead wire away from the base substrate; forming adapter holes running through the insulating structure, at locations where the plurality of fan-out lines and the plurality of signal data lines are adjacent to each other, and at locations where the first lead wire segment and the second lead wire segment are adjacent to each other; and forming a conducting layer on a side of the insulating structure away from the base substrate, so that the conducting layer implements, through the adapter holes, lapping between the plurality of fan-out lines and the plurality of data signal lines, and lapping between the first lead wire segment and the second lead wire segment.

BRIEF DESCRIPTION OF THE DRAWINGS

The drawings constituting a part of the specification describe embodiments of the present disclosure, and together with the specification, serve to explain the principle of the present disclosure.

With reference to the accompanying drawings, the present disclosure can be understood more clearly according to the following detailed description, in which:

Figure 1:
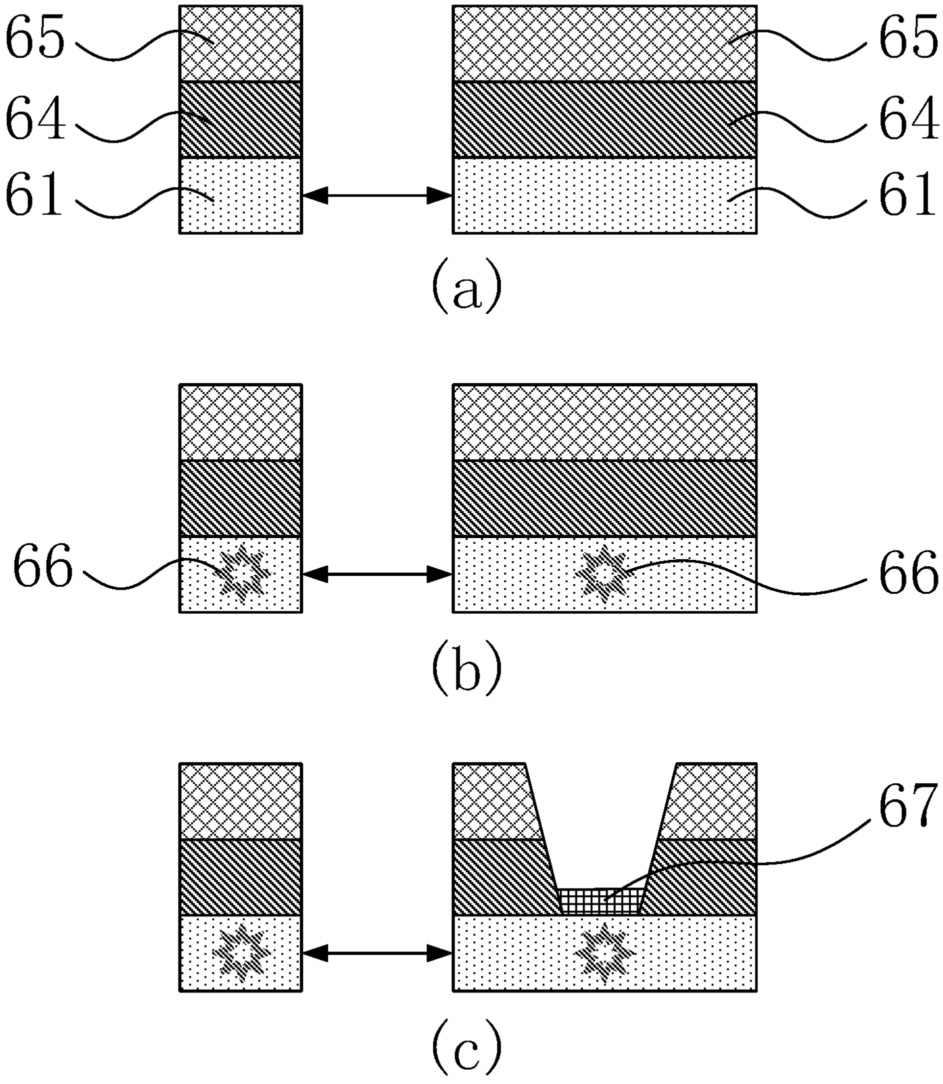
Figure 2:
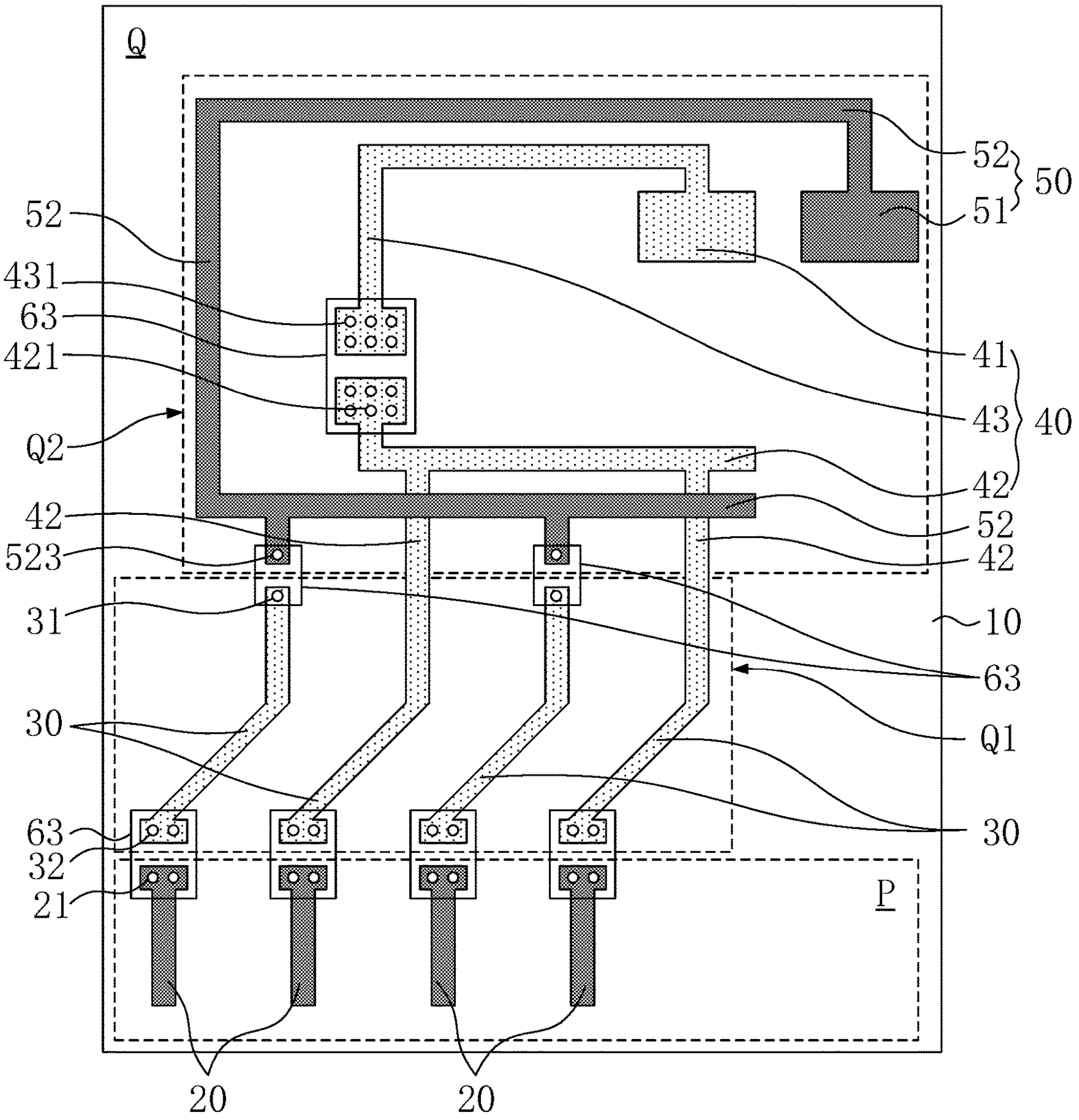
Figure 3:
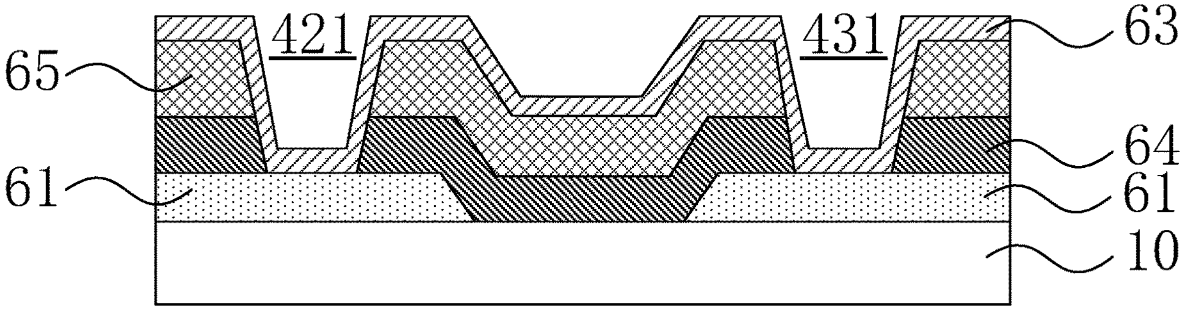
Figure 4:
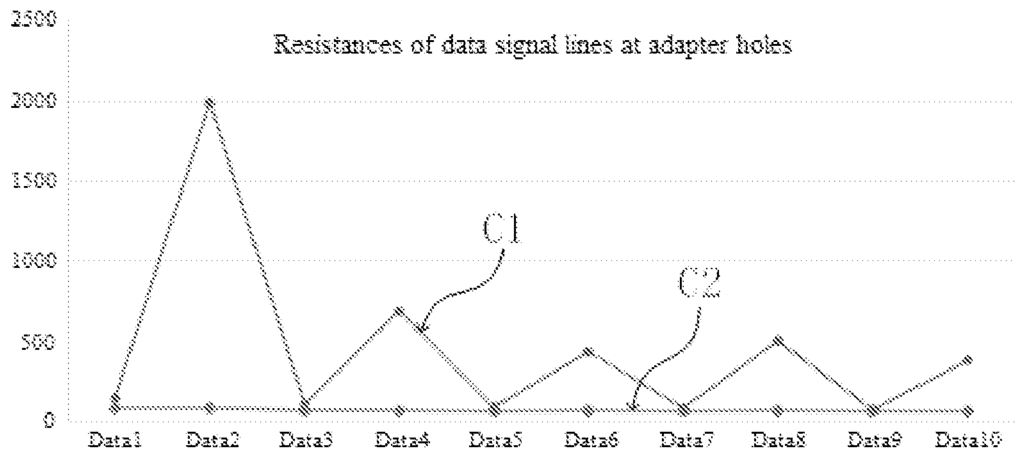
Figure 5:
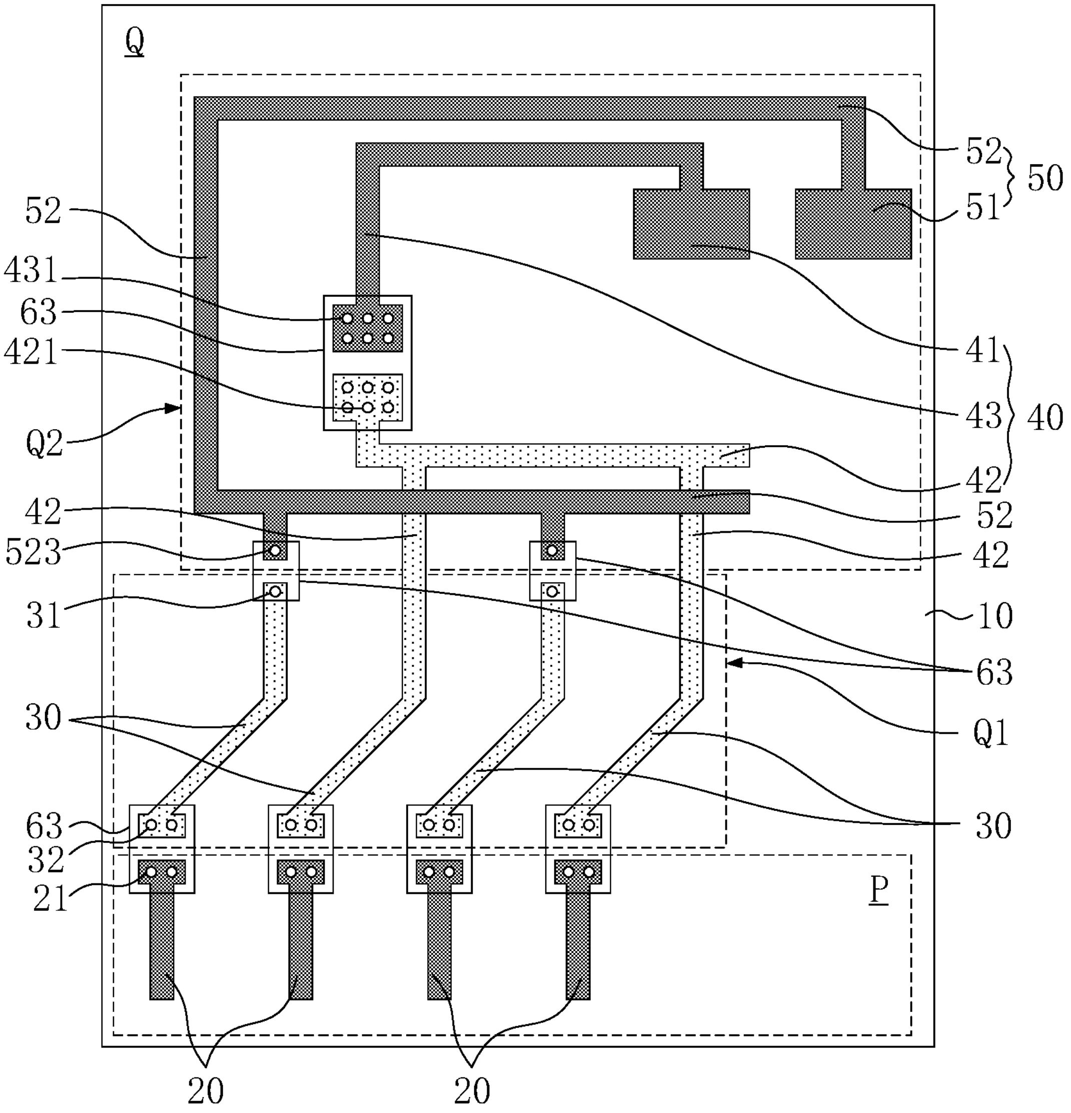
Figure 6:
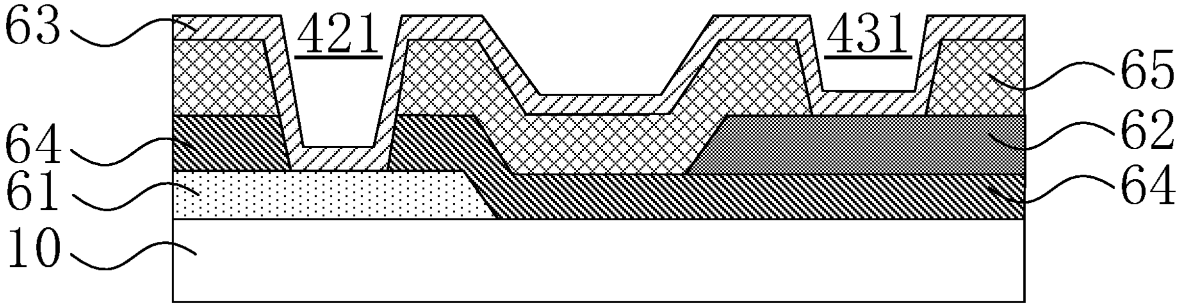
Figure 7:
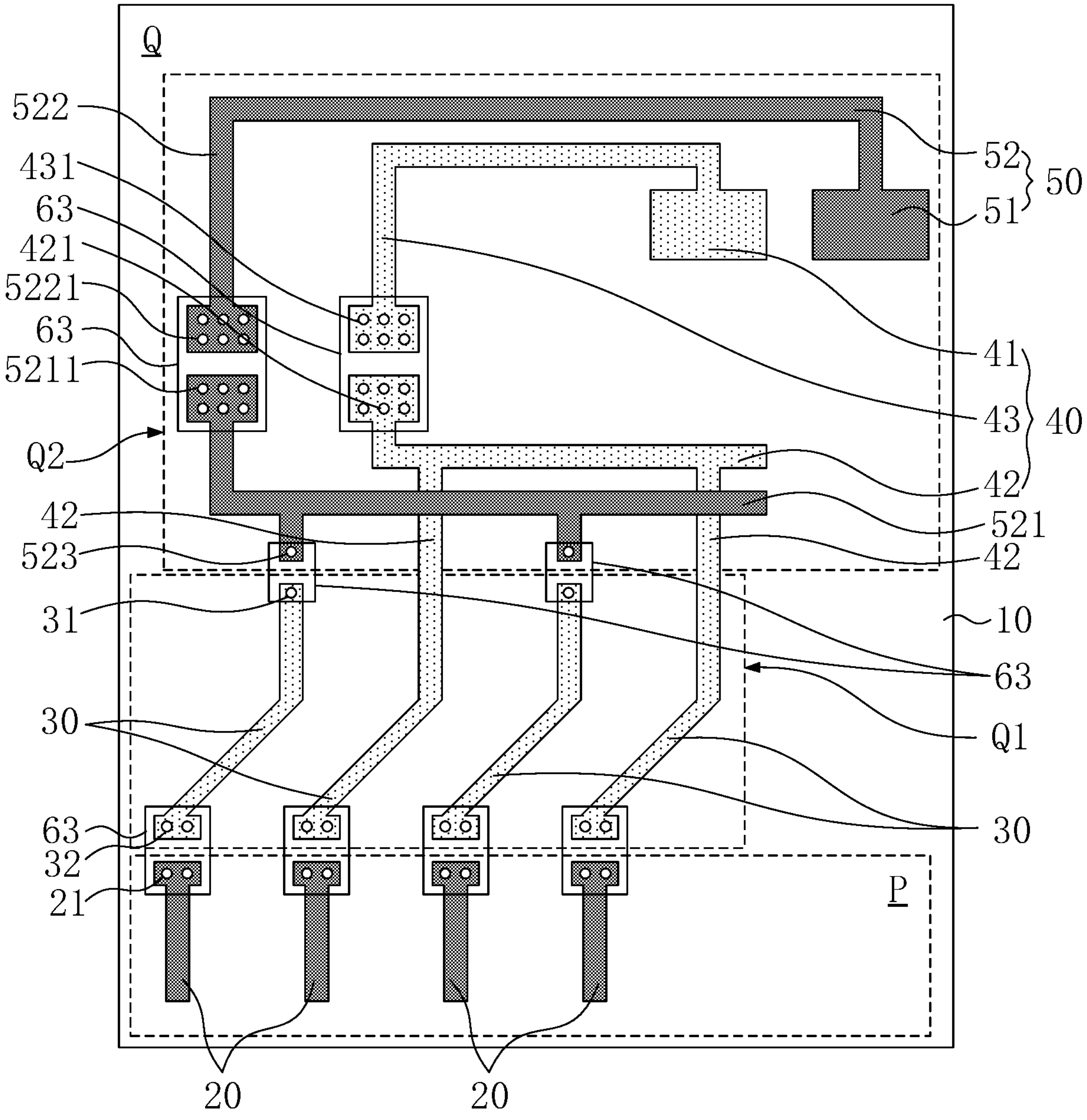
Figure 8:
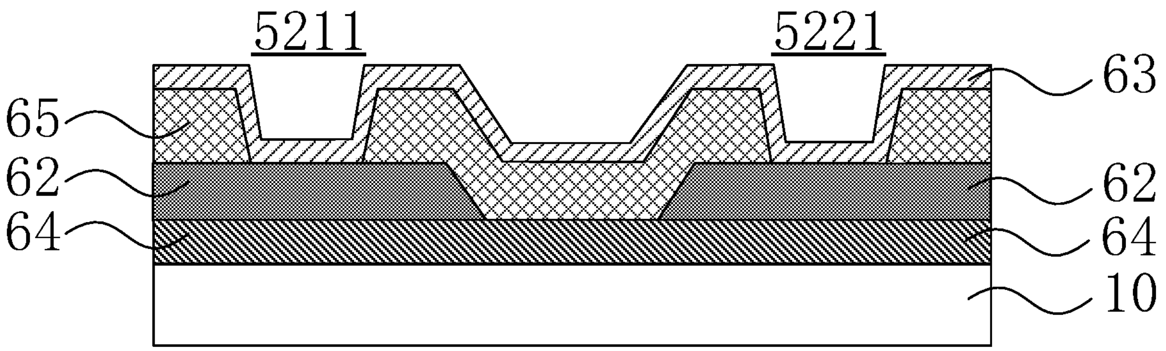
Figure 9:
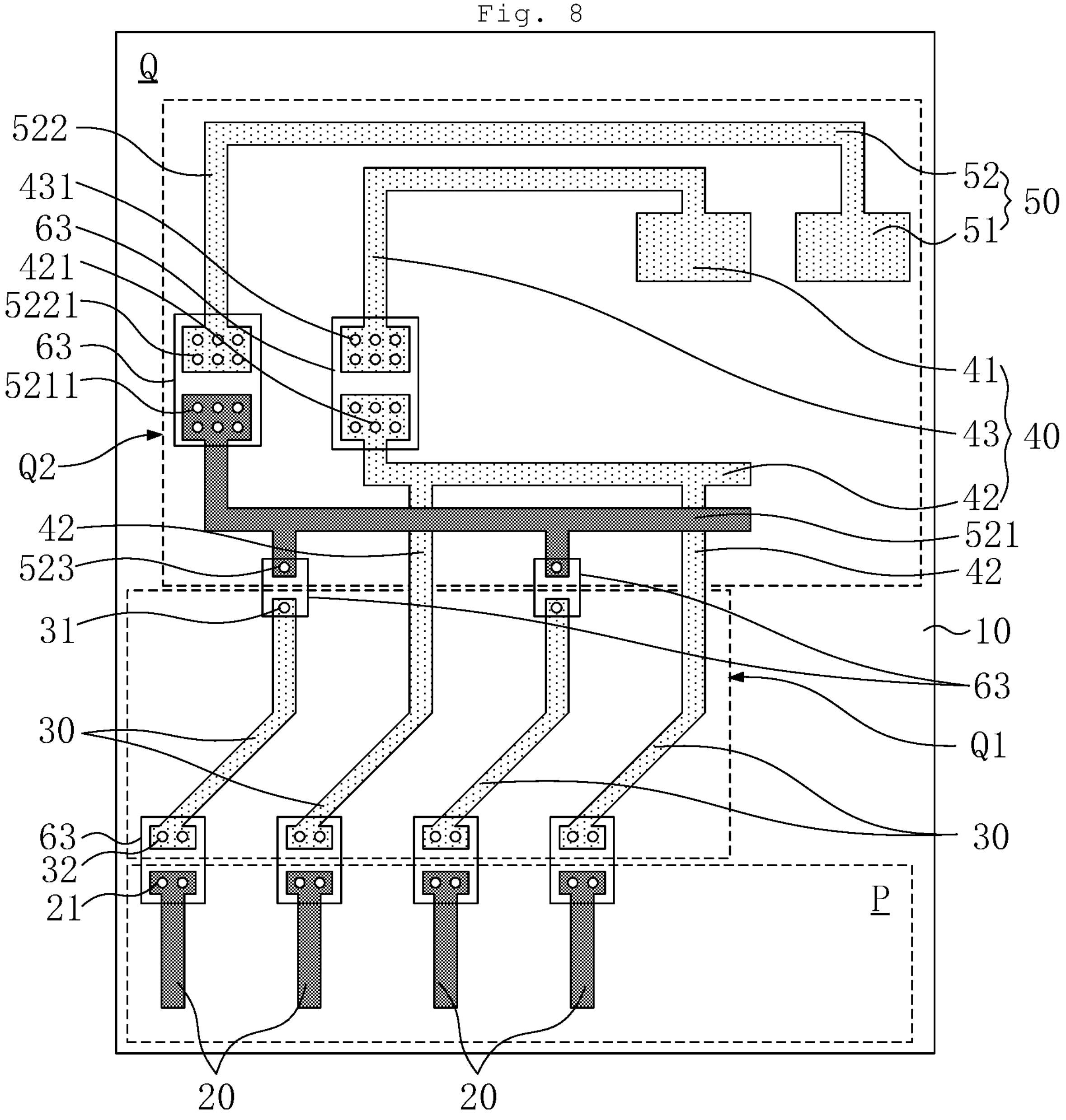
Figure 10:
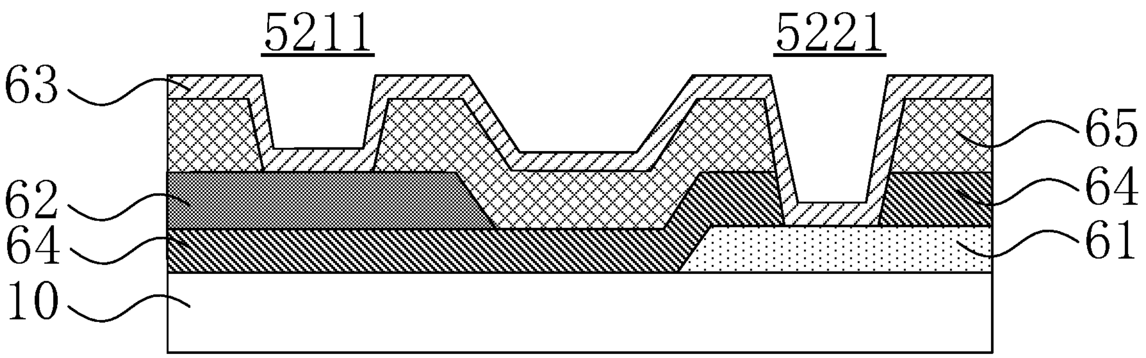
Figure 12:
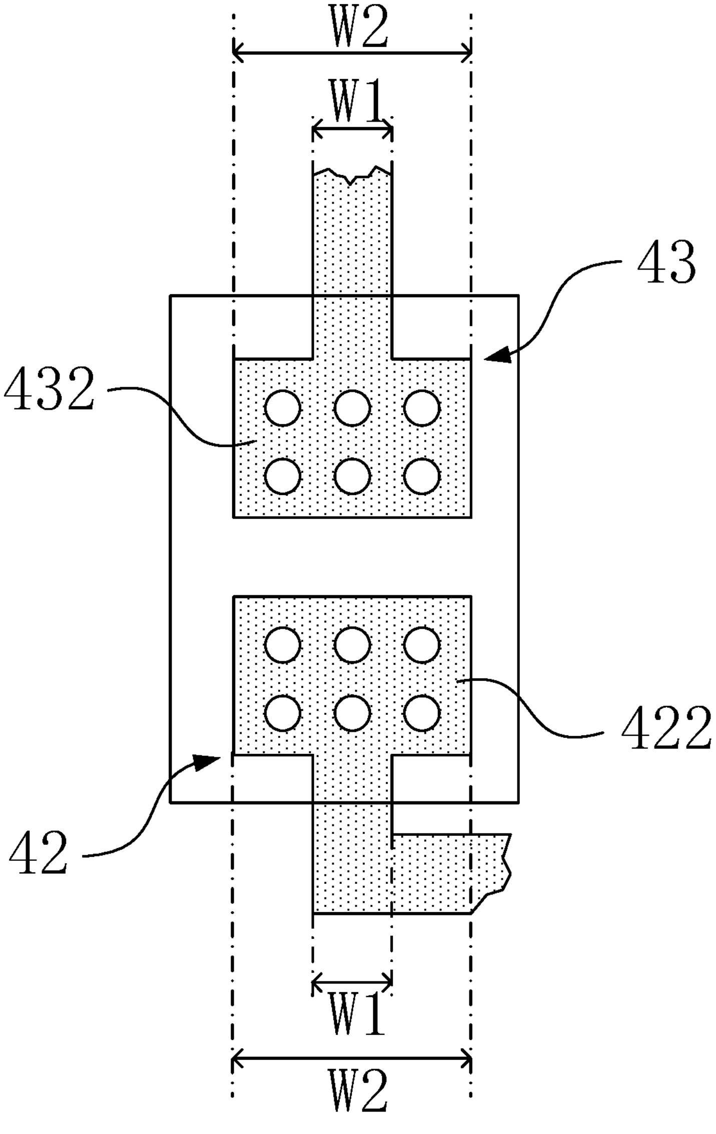
Figure 13:
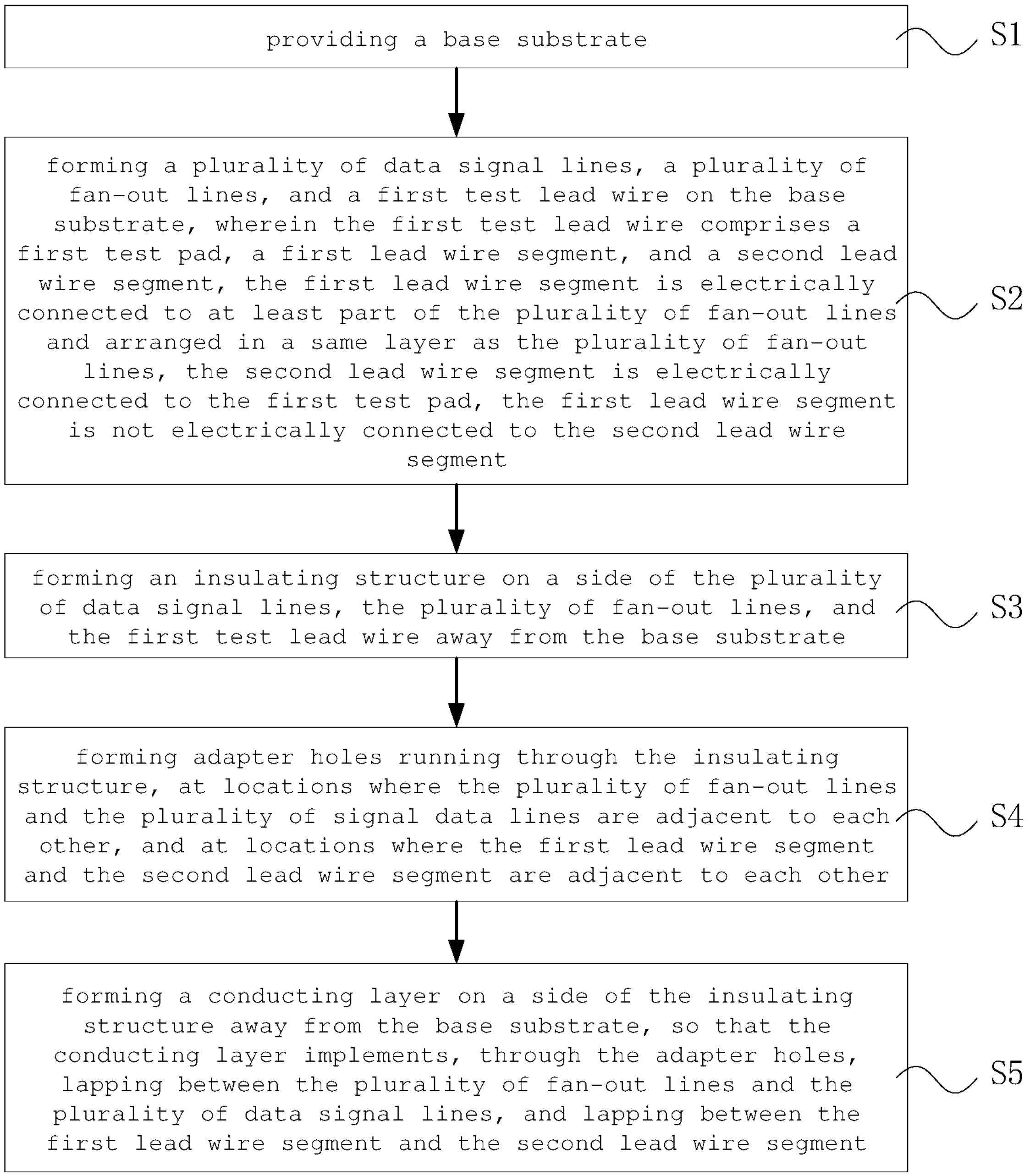

(a)-(c) of FIG. 1 are schematic diagrams of an electrochemical oxidation behavior of metal in a gate material layer at an adapter hole for a data signal line to which a test lead wire is connected in the related art;

FIG. 2 is a structural diagram of an embodiment of an array substrate in the present disclosure;

FIG. 3 is a schematic diagram illustrating lapping of a first lead wire segment and a second lead wire segment through an adapter hole in FIG. 2;

FIG. 4 is a schematic comparison diagram of resistances of a plurality of data signal lines at adapter holes in the case of a continuous test lead wire in the related art versus those in the case of lead wire segments lapped through adapter holes in embodiments of the present disclosure;

FIGS. 5, 7, 9 and 11 are respectively structural diagrams of some embodiments of an array substrate in the present disclosure;

FIG. 6 is a schematic cross-sectional diagram illustrating lapping of a first lead wire segment and a second lead wire segment through an adapter hole in FIG. 5;

FIG. 8 is a schematic cross-sectional diagram illustrating lapping of a third lead wire segment and a fourth lead wire segment through an adapter hole in FIG. 7;

FIG. 10 is a schematic cross-sectional diagram illustrating lapping of a third lead wire segment and a fourth lead wire segment through an adapter hole in FIG. 9;

FIG. 12 is a schematic enlarged diagram illustrating lapping of a first lead wire segment and a second lead wire segment through an adapter hole in FIG. 2; and FIG. 13 is a schematic flow diagram of an embodiment of a method for manufacturing an array substrate in the present disclosure.

It should be appreciated that the sizes of various parts shown in the drawings are not drawn in accordance with actual proportional relationships. In addition, same or similar reference numerals represent same or similar components.

DESCRIPTION OF THE INVENTION

Various exemplary embodiments of the present disclosure will now be described in detail with reference to the accompanying drawings. The description of the exemplary embodiments is only illustrative, and in no way serves as any limitation on the present disclosure and its application or use. The present disclosure can be implemented in many different forms and is not limited to the embodiments described herein. These embodiments are provided to make the present disclosure thorough and complete and to express fully the scope of the present disclosure to those skilled in the art. It is to be noted that unless specifically stated otherwise, the relative arrangement of components and steps, material components, numerical expressions and numerical values set forth in these embodiments should be construed as merely exemplary, rather than as limitations.

The words "first", "second" and the like used in present disclosure do not indicate any order, quantity or importance, but are only used to distinguish different parts. The word "comprise" or "include" or the like means that an element preceding the word covers listed elements following the word, and does not exclude the possibility of also covering other elements. The words "up", "down", "left", "right" and the like are only used to indicate a relative positional relationship. When the absolute position of a described object changes, the relative positional relationship may also change accordingly.

In the present disclosure, when a particular device is described to be located between a first device and a second device, there may or may not be an intermediate device between the particular device and the first device or the second device. When a particular device is described to be connected to other device, the particular device may be directly connected to the other device without an intermediate device, or it may be not directly connected to the other device but there is an intermediate device.

All terms (including technical or scientific terms) used in the present disclosure have the same meaning as understood by those of ordinary skill in the field of the present disclosure, unless otherwise defined specifically. It should also be understood that terms such as those defined in generic dictionaries should be understood to have meanings consistent with their meanings in the context of the related art, and should not be construed in an idealized or overly formalized sense, unless so defined explicitly herein.

Technologies, methods, and apparatuses known to those of ordinary skill in the related art may be not discussed in detail, but where appropriate, the technologies, methods, and apparatuses should be regarded as part of the specification.

(a)-(c) of FIG. 1 are schematic diagrams of an electrochemical oxidation behavior of metal in a gate material layer at an adapter hole for a data signal line to which a test lead wire is connected in the related art.

Referring to (a) of FIG. 1, in some related art, a portion of a test pad (Pad) is prepared from metal in a gate material layer (Gate) 61, and is connected to fan-out lines (fan-out) also located in the gate material layer 61 through a lead wire (Lead) in the same layer. The fan-out lines are lapped with data signal lines located in a source-drain material layer (SD) through adapter holes (VIA) and a conducting layer.

In (a) of FIG. 1, a gate insulating layer (GI) 64 and a passivation layer (PVX) 65 are successively arranged on the gate material layer 61. The gate material layer 61 on the left side is a test pad, the gate material layer 61 on the right side is an end of a fan-out line, and a bidirectional arrow indicates that the test pad and the end of the fan-out line are electrically connected at the gate material layer 61.

Referring to (b) of FIG. 1, a deposition process of the conducting layer is performed before an etching process of the adapter holes. The use of pins or rollers in preparing the display substrate can cause static electricity near edges of the substrate, and the static electricity may move to the test pad. The static electricity 66 on the test pad on the left side can move to the end of the fan-out line on the right side.

Referring to (c) of FIG. 1, when adapter hole etching is performed at the end of the fan-out line on the right side, a plasma-based environment causes release of the static electricity, and the static electricity causes an electrochemical oxidation behavior of the surface of the gate material layer 61 at the adapter hole, thereby generating a poorly conductive metal oxide layer 67, which increases the resistance of the adapter hole there, leading to the problem of abnormal screen display, such as X-thin dark lines, caused by an insufficient charging rate of part of pixels, thus affecting the product yield.

In view of this, embodiments of the present disclosure provide an array substrate, a display panel, a display device, and a method for manufacturing an array substrate, which can improve the product yield.

FIG. 2 is a structural diagram of an embodiment of an array substrate in the present disclosure.

Referring to FIG. 2, embodiments of the present disclosure provide an array substrate including: a base substrate 10, a plurality of data signal lines 20, a plurality of fan-out lines 30, and a first test lead wire 40. The base substrate 10 may be a rigid substrate such as a glass substrate or a quartz substrate, and may also be a flexible substrate such as a polyimide (PI) substrate.

The plurality of data signal lines 20 are arranged on the base substrate 10. The plurality of fan-out lines 30 are arranged side-by-side on the base substrate 10 and are respectively lapped with the plurality of data signal lines 20 through adapter holes. The first test lead wire 40 is arranged on the base substrate 10.

The first test lead wire 40 includes a first test pad 41, a first lead wire segment 42, and a second lead wire segment 43. The first lead wire segment 42 is electrically connected to at least a part of the plurality of fan-out lines 30 and arranged in a same layer as the plurality of fan-out lines 30. The second lead wire segment 43 is electrically connected to the first test pad 41 and lapped with the first lead wire segment 42 through an adapter hole.

In this embodiment, the second lead wire segment 43 electrically connected to the first test pad 41 is lapped, through an adapter hole, with the first lead wire segment 42 that is arranged in the same layer as and electrically connected to the fan-out lines 30, and before a lapped structure for implementing the electrical connection between the first lead wire segment 42 and the second lead wire segment 43 is provided, the first lead wire segment 42 and the second lead wire segment 43 may be spaced apart and not electrically connected to each other to avoid that static electricity on the first test pad 41 moves to the fan-out lines 30 to which the first lead wire segment 42 is electrically connected. In this way, when adapter hole etching is performed on an end of a fan-out line adjacent to a data signal line, generation of a metal oxide layer with poor electrical conductivity by release of static electricity does not occur, thereby avoiding resistance increases at the adapter hole there, and effectively eliminating the problem of abnormal display caused by an insufficient charging rate of part of pixels due to resistance increases at the adapter hole in the related art, thus improving the product yield.

Referring to FIG. 2, in some embodiments, the array substrate has a display area P and a non-display area Q at least partially surrounding the display area P. The non-display area Q includes a fan-out area Q1 and a test lead wire area Q2. The plurality of fan-out lines 30 are at least partially located in the fan-out area Q1, and the first test lead wire 40 is at least partially located in the test lead wire area Q2.

The plurality of data signal lines 20 may be arranged side-by-side in a source-drain material layer and electrically connected to source electrodes of pixel units located in the display area P. The fan-out lines 30 may be located in a gate material layer and not in a same layer as the data signal lines 20. Adapter holes 21 may be provided at an end of each data signal line 20 adjacent to a corresponding fan-out line 30, and adapter holes 32 may be provided at an end of the fan-out line 30 adjacent to the data signal line 20, and a conducting layer 63 is lapped with the data signal line 20 and the fan-out line 30 through the adapter holes 21 and the adapter holes 32, respectively, thereby implementing an electrical connection between the data signal line 20 and the fan-out line 30.

FIG. 3 is a schematic cross-sectional diagram illustrating lapping of a first lead wire segment and a second lead wire segment through an adapter hole in FIG. 2.

Referring to FIGS. 2 and 3, in some embodiments, the first lead wire segment 42 is lapped with the second lead wire segment 43 at the adapter holes by conducting layers 63 located on a side of a layer where the first lead wire segment 42 is located and a layer where the second lead wire segment 43 is located away from the base substrate 10.

In FIGS. 2 and 3, an end of the first lead wire segment 42 adjacent to the second lead wire segment 43 may be provided with at least one adapter hole 421, and the number and size of the adapter hole 421 may be set according to the size of the end. An end of the second lead wire segment 43 adjacent to the first lead wire segment 42 may be provided with at least one adapter hole 431, and the number and size of the adapter hole 431 may be set according to the size of the end. The conducting layer 63 is lapped with the adapter hole 431 and adapter hole 421, respectively, thereby realizing electrically connecting between the first lead wire segment 42 and the second lead wire segment 43.

The first lead wire segment 42 and the second lead wire segment 43 shown in FIG. 2 are both located in the gate material layer 61, and there is a spacing between their ends such that they are not directly connected in the same layer. The adapter hole 421 may be obtained by etching a gate insulating layer 64 and a passivation layer 65 located on the gate material layer 61, the first lead wire segment 42 on the left side is exposed at the bottom of the adapter hole 421. The adapter hole 431 may also be obtained by etching the gate insulating layer 64 and the passivation layer 65 located on the gate material layer 61, and the second lead wire segment 43 on the left side is exposed at the bottom of the adapter hole 431. The conducting layer 63 may be formed on the passivation layer 65 and cover the adapter hole 421 and the adapter hole 431 to achieve lapping of the first lead wire segment 42 and the second lead wire segment 43.

In some embodiments, the material of the conducting layer 63 may be indium tin oxide (ITO), and may also be any of other conductive materials such as conductive polymers, metal grids, carbon nanorods, silver nanowires, graphene, and the like.

Referring to FIG. 2, in some embodiments, the array substrate further includes a second test lead wire 50 arranged on the base substrate 10. The second test lead wire 50 includes a second test pad 51 and a lead wire 52. The first lead wire segment 42 is electrically connected to a part of the plurality of fan-out lines 30, and the lead wire 52 is lapped through adapter holes with another part of the plurality of fan-out lines 30 and electrically connected to the second test pad 51.

The first test lead wire 40 and the second test lead wire 50 may be configured for testing of different parts of the data signal lines 20 in the display area P, respectively, to determine a defect location more easily during testing. For example, the first test lead wire 40 is configured for testing of data signal lines 20 in odd-numbered columns, and the second test lead wire 50 is configured for testing of data signal lines 20 in even-numbered columns. In other embodiments, a single test lead wire or more test lead wires may be provided.

Considering a situation that the first test lead wire 40 and the second test lead wire 50 are connected to the fan-out lines in a line-crossing manner, the lead wire 52 may be arranged in a different layer from the first lead wire segment 42.

In FIG. 2, an end of the lead wire 52 adjacent to a fan-out line 30 may be provided with an adapter hole 523, and an end of the fan-out line 30 adjacent to the lead wire 52 may be provided with an adapter hole 31. The conducting layer 63 is lapped with the lead wire 52 and the fan-out line 30 through the adapter hole 523 and the adapter hole 31, respectively, thereby implementing an electrical connection between the lead wire 52 and the fan-out line 30.

Since the lead wire 52 is located in a different layer from the fan-out line 30 before a lapped structure for implementing the electrical connection between the lead wire 52 and the fan-out line 30 is provided, it avoids that static electricity on the second test pad 51 moves to the fan-out line 30. In this way, when adapter hole etching is performed at an end of a fan-out line adjacent to a data signal line, generation of a metal oxide layer with poor electrical conductivity by release of static electricity does not occur, thereby avoiding resistance increases at adapter holes there, and effectively eliminating the problem of abnormal display caused by an insufficient charging rate of part of pixels due to resistance increases at adapter holes in the related art, thus improving the product yield.

FIG. 4 is a schematic comparison diagram of resistances of a plurality of data signal lines at adapter holes in the case of a continuous test lead wire in the related art versus those in the case of lead wire segments lapped through adapter holes in embodiments of the present disclosure.

With reference to the embodiment shown in FIG. 2 and the resistance comparison diagram shown in FIG. 4, 10 points on a horizontal axis from left to right in FIG. 4 respectively correspond to 10 data signal lines arranged side by side in the display area, and a vertical axis indicates resistance values of the data signal lines at the adapter holes. Data signal lines in odd-numbered columns correspond to the second test lead wire, and data signal lines in even-numbered columns correspond to the first test lead wire.

Compared with the embodiment shown in FIG. 2, the related art uses a similar second test lead wire and its connecting relationship, while a continuous lead wire is used to the lead wire part corresponding to the first test lead wire. In this way, the first test lead wire causes static electricity from the first test pad to move to the fan-out lines, thereby generating metal oxides when adapter hole etching is performed at the ends of the fan-out lines.

In FIG. 4, the related art corresponds to a line C1 connecting individual round points, while the embodiment shown in FIG. 2 corresponds to a line C2 connecting individual rhombic points. The connecting line C1 indicates that the resistances of the adapter holes for the data signal lines in the even-numbered columns are higher, and the resistance increases are caused by the metal oxides generated at the bottoms of the adapter holes, while the connecting line C2 indicates that the resistances of the adapter holes for the data signal lines in the even-numbered columns are all kept low. Hence, embodiments of the present disclosure can effectively eliminate the problem of abnormal display caused by an insufficient charging rate of part of pixels due to resistance increases at adapter holes in the related art, thus improving the product yield.

In FIG. 2, one end of the second lead wire segment 43 is connected to the first test pad 41 located in the array substrate away from the display area P, and the other end extends toward the display area P. The first lead wire segment 42 is located on a side of the second lead wire segment 43 adjacent to the display area P. The first lead wire segment 42 may include a single lead wire segment lapped with the second lead wire segment 43 through adapter holes, and a plurality of branch lead wire segments respectively connected to a plurality of fan-out lines. The plurality of branch lead wire segments are all connected to the single lead wire segment.

The adapter holes between the first lead wire segment 42 and the second lead wire segment 43 are located on a side of the second lead wire segment 43 adjacent to the display area P. As the adapting structure here is far from the first test pad, interference with other devices such as pins or rollers during preparation of the display substrate is not likely to occur.

FIGS. 5, 7, 9 and 11 are respectively structural diagrams of some embodiments of an array substrate in the present disclosure. FIG. 6 is a schematic cross-sectional diagram illustrating lapping of a first lead wire segment and a second lead wire segment through an adapter hole in FIG. 5. FIG. 8 is a schematic cross-sectional diagram illustrating lapping of a third lead wire segment and a fourth lead wire segment through an adapter hole in FIG. 7. FIG. 10 is a schematic cross-sectional diagram illustrating lapping of a third lead wire segment and a fourth lead wire segment through an adapter hole in FIG. 9.

Referring to the embodiment shown in FIG. 2, the plurality of fan-out lines 30, the first lead wire segment 42 and the second lead wire segment 43 are arranged in a same layer and made of a same material, which allows the fan-out lines 30, the first lead wire segment 42 and the second lead wire segment 43 to be formed by a same patterning process, which simplifies the processing procedure. Referring to FIG. 3, in some embodiments, the plurality of fan-out lines 30, the first lead wire segment 42, and the second lead wire segment 43 are all located in a gate material layer 61.

Compared to the embodiment shown in FIG. 2, the first lead wire segment 42 is arranged in a different layer from the second lead wire segment 43 in the embodiment shown in FIG. 5. Referring to FIG. 6, in some embodiments, the plurality of fan-out lines 30 and the first lead wire segment 42 are both located in a gate material layer 61 and made of a same material, and the second lead wire segment 43 is located in a source-drain material layer 62.

Referring to the embodiment shown in FIG. 2, the lead wire 52 is arranged in a different layer from the plurality of fan-out lines 30. For example, the plurality of fan-out lines 30 are located in a gate material layer 61, and the lead wire 52 is located in a source-drain material layer 62.

Compared to the embodiment shown in FIG. 2, the lead wire 52 in the embodiment shown in FIG. 7 includes a third lead wire segment 521 and a fourth lead wire segment 522. The third lead wire segment 521 is arranged in a different layer from the plurality of fan-out lines 30 and lapped with another part of the plurality of fan-out lines 30 through adapter holes, and the fourth lead wire segment 522 is electrically connected to the second test pad 51 and lapped with the third lead wire segment 521 through adapter holes.

Before a lapped structure for implementing the electrical connection between the third lead wire segment 521 and the fourth lead wire segment 522 is provided, the third lead wire segment 521 and the fourth lead wire segment 522 may be spaced apart and not electrically connected to each other to avoid that static electricity on the second test pad 51 moves to the fan-out lines 30 with which the third lead wire segment 521 is electrically connected through the adapter holes. In this way, when adapter hole etching is performed at an end of a fan-out line adjacent to a data signal line, generation of a metal oxide layer with poor electrical conductivity by release of static electricity does not occur, thereby avoiding resistance increases at adapter holes there, and effectively eliminating the problem of abnormal display caused by an insufficient charging rate of part of pixels due to resistance increases at adapter holes in the related art, thus improving the product yield.

Considering a situation that the first test lead wire 40 and the second test lead wire 50 are connected to the fan-out lines in a line-crossing manner, the third lead wire segment 521 may be arranged in a different layer from the first lead wire segment 42.

Referring to the embodiment shown in FIG. 7, the third lead wire segment 521 and the fourth lead wire segment 522 are arranged in a same layer and made of a same material, which allows the third lead wire segment 521 and the fourth lead wire segment 522 to be formed by a same patterning process, which simplifies the processing procedure. Referring to FIG. 8, in some embodiments, the third lead wire segment 521 and the fourth lead wire segment 522 are both located in a source-drain material layer 62, and the plurality of fan-out lines 30 are located in a gate material layer 61.

In FIG. 7, one end of the fourth lead wire segment 522 is connected to the second test pad 51 located on the array substrate away from the display area P, and the other end extends toward the display area P. The third lead wire segment 521 is located on a side of the fourth lead wire segment 522 adjacent to the display area P. The third lead wire segment 521 may include a single lead wire segment lapped with the fourth lead wire segment 522 through adapter holes, and a plurality of branch lead wire segments respectively connected to a plurality of fan-out lines. The plurality of branch lead wire segments are all connected to the single lead wire segment.

Compared to the embodiment shown in FIG. 7, the third lead wire segment 521 and the fourth lead wire segment 522 are arranged in different layers in the embodiment shown in FIG. 9. Referring to FIG. 10, in some embodiments, the third lead wire segment 521 is located in a source-drain material layer 62, and the fourth lead wire segment 522 and the plurality of fan-out lines 30 are both located in a gate material layer 61.

Figure 11:
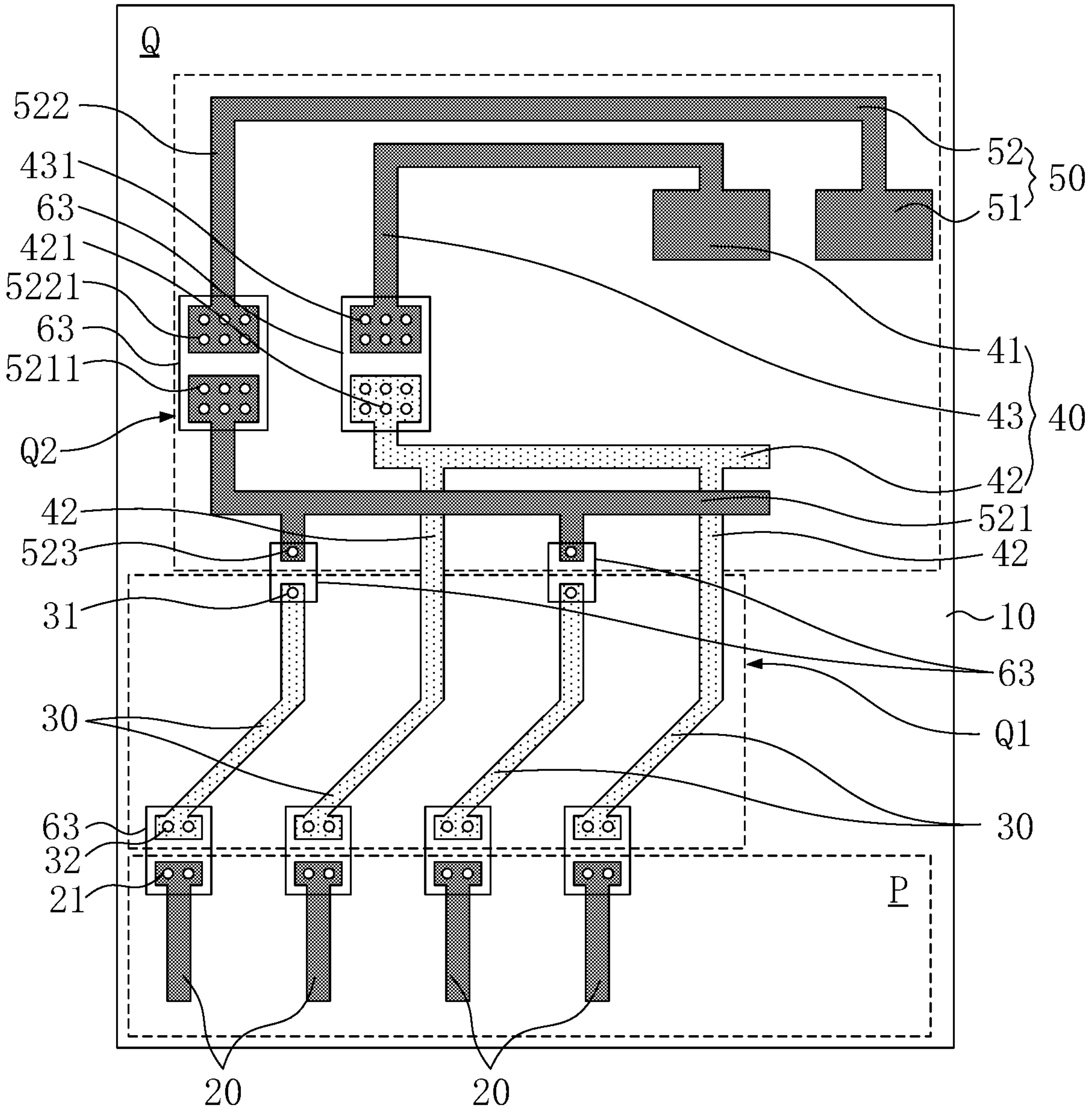

Compared to the embodiment shown in FIG. 7, the first lead wire segment 42 and the second lead wire segment 43 are arranged in different layers in the embodiment shown in FIG. 11. Referring to FIG. 6, in some embodiments, the plurality of fan-out lines 30 and the first lead wire segment 42 are both located in a gate material layer 61 and made of a same material, and the second lead wire segment 43 is located in a source-drain material layer 62.

FIG. 12 is a schematic enlarged diagram illustrating lapping of a first lead wire segment and a second lead wire segment through an adapter hole in FIG. 2.

Referring to FIGS. 2 and 12, in some embodiments, the width of an end of at least one of the first lead wire segment 42 and the second lead wire segment 43 for providing adapter holes is not less than the width of a lead wire segment portion adjacent to the end. In FIG. 12, the width of an end 422 of the first lead wire segment 42 for providing the adapter holes 421 is W2, and the width of a lead wire segment portion of the first lead wire segment 42 adjacent to an end 422 is W1, and W2 is greater than W1. In this way, the reliability of lapping can be ensured by the wider end in the case where the width of the lead wire segment portion is small, thus avoiding the effect of adapter hole lapping abnormality in an array test (abbreviated as AT) process. In other embodiments, if the lead wire segment portion is wide, the width of the end may be equal to the width of the lead wire segment portion. The width here refers to a dimension in a direction perpendicular to the direction of extension of the lead wire segment. Similarly, the width W2 of an end 432 of the second lead wire segment 43 for providing the adapter holes 431 is not less than the width W1 of a lead wire segment portion adjacent to the end 432.

The above embodiments of the array substrate of the present disclosure are applicable to a display panel. Thus, in an aspect of the present disclosure, there is also provided a display panel including the array substrate in any of the foregoing embodiments. The display panel may be any one of an OLED (Organic Light Emitting Diode) display panel, a QLED (Quantum dot Light Emitting Diode) display panel, a mini LED or micro LED display panel, and other self-luminous display panels, and may also be an LCD (Liquid Crystal Display) panel.

The display panels of the above embodiments of the present disclosure may be applied to various types of display devices, and may also be applied in other fields, such as lighting devices. Therefore, embodiments of the present disclosure also provide a display device including the display panel in any of the foregoing embodiments. The display apparatus may be a mobile phone, a tablet computer, a television, a display, a notebook computer, a digital photo frame, a navigator, or any other product or component with a display function.

FIG. 13 is a schematic flow diagram of an embodiment of a method for manufacturing an array substrate in the present disclosure.

Referring to the array substrate in the foregoing embodiments of the present disclosure and FIG. 13, embodiments of the present disclosure also provide a method for manufacturing an array substrate. The method for manufacturing an array substrate includes steps S1 to S5.

In step S1, a base substrate 10 is provided.

In step S2, a plurality of data signal lines 20, a plurality of fan-out lines 30, and a first test lead wire 40 are formed on the base substrate 10. The first test lead wire 40 includes a first test pad 41, a first lead wire segment 42, and a second lead wire segment 43. The first lead wire segment 42 is electrically connected to at least a part of the plurality of fan-out lines 30 and arranged in a same layer as the plurality of fan-out lines 30. the second lead wire segment 43 is electrically connected to the first test pad 41, and the first lead wire segment 42 is not electrically connected to the second lead wire segment 43.

If the first lead wire segment 42 and the second lead wire segment 43 are located in a same layer, a spacing may be formed between the first lead wire segment 42 and the second lead wire segment 43 in a patterning process, so that no electrical connection is formed between the first lead wire segment 42 and the second lead wire segment 43. It is also possible that the first lead wire segment 42 and the second lead wire segment 43 are located in different layers so that no electrical connection is formed between the first lead wire segment 42 and the second lead wire segment 43.

In step S3, an insulating structure is formed on a side of the plurality of data signal lines 20, the plurality of fan-out lines 30, and the first test lead wire 40 away from the base substrate 10. The insulating structure may include a gate insulating layer, a passivation layer, and the like, and may also include an interlayer dielectric layer, and the like.

In step S4, adapter holes running through the insulating structure are formed at locations where the plurality of fan-out lines 30 and the plurality of signal data lines are adjacent to each other, and at locations where the first lead wire segment 42 and the second lead wire segment 43 are adjacent to each other.

In step S5, a conducting layer 63 is formed on a side of the insulating structure away from the base substrate 10, so that the conducting layer 63 implements, through the adapter holes, lapping between the plurality of fan-out lines 30 and the plurality of data signal lines 20, and lapping between the first lead wire segment 42 and the second lead wire segment 43.

Since the first lead wire segment 42 and the second lead wire segment 43 are not electrically connected during the execution of step S4, it avoids that static electricity on the first test pad 41 moves to the fan-out lines 30 with which the first lead wire segment 42 is electrically connected, and when adapter hole etching is performed at an end of a fan-out line 30 adjacent to a data signal line 20, generation of a metal oxide layer with poor electrical conductivity by release of static electricity does not occur, thereby avoiding resistance increases at adapter holes there, and effectively eliminating the problem of abnormal display caused by an insufficient charging rate of part of pixels due to resistance increases at adapter holes in the related art, thus improving the product yield.

Multiple embodiments in the specification are described in a progressive manner. Focuses of the embodiments are different. For the same and similar parts among the embodiments, refer can be made to each other. For the method embodiments, since the whole method and the involved steps are in a corresponding relationship with those in the product embodiments, their description is relatively simple, and for relevant parts, please refer to part of description of the product embodiments.

Now, embodiments of the present disclosure have been described in detail. To avoid obscuring the concept of the present disclosure, some details known in the art are not described. Based on the above description, those skilled in the art can fully understand how to implement the technical solutions disclosed herein.

Although some specific embodiments of the present disclosure have been described in detail by using examples, those skilled in the art should understand that the above examples are only for illustration and not for limiting the scope of the present disclosure. Those skilled in the art should understand that modifications to the above embodiments or equivalent substitutions to part of technical features can be made without departing from the scope and spirit of the present disclosure. The scope of the present disclosure is defined by the appended claims.

What is claimed is:

1. An array substrate, comprising:

a base substrate;

a plurality of data signal lines arranged on the base substrate;

a plurality of fan-out lines arranged side-by-side on the base substrate and respectively lapped with the plurality of data signal lines through adapter holes; and a first test lead wire arranged on the base substrate, wherein the first test lead wire comprises a first test pad, a first lead wire segment, and a second lead wire segment, the first lead wire segment is electrically connected to at least a part of the plurality of fan-out lines and arranged in a same layer as the plurality of fan-out lines, and the second lead wire segment is electrically connected to the first test pad and lapped with the first lead wire segment through an adapter hole; and the first lead wire segment is lapped with the second lead wire segment at the adapter hole by conducting layers located on a side of a layer where the first lead wire segment is located and a layer where the second lead wire segment is located, which is away from the base substrate.

2. The array substrate according to claim 1, wherein the plurality of fan-out lines, and the first lead wire segment and the second lead wire segment are arranged in a same layer and made of a same material.

3. The array substrate according to claim 2, wherein the plurality of fan-out lines, the first lead wire segment, and the second lead wire segment are all located in a gate material layer.

4. The array substrate according to claim 1, wherein the first lead wire segment is arranged in a different layer from the second lead wire segment.

5. The array substrate according to claim 4, wherein the plurality of fan-out lines and the first lead wire segment are both located in a gate material layer and made of a same material, and the second lead wire segment is located in a source-drain material layer.

6. The array substrate according to claim 1, further comprising:

a second test lead wire arranged on the base substrate, wherein the second test lead wire comprises a second test pad and a lead wire, the first lead wire segment is electrically connected to a part of the plurality of fan-out lines, and the lead wire is lapped with another part of the plurality of fan-out lines through adapter holes and electrically connected to the second test pad.

7. The array substrate according to claim 6, wherein the lead wire is arranged in a different layer from the plurality of fan-out lines.

8. The array substrate according to claim 7, wherein the plurality of fan-out lines are located in a gate material layer, and the lead wire is located in a source-drain material layer.

9. The array substrate according to claim 6, wherein the lead wire comprises a third lead wire segment and a fourth lead wire segment, the third lead wire segment is arranged in a different layer from the plurality of fan-out lines and lapped with another part of the plurality of fan-out lines through adapter holes, and the fourth lead wire segment is electrically connected to the second test pad and lapped with the third lead wire segment through an adapter hole.

10. The array substrate according to claim 9, wherein the third lead wire segment and the fourth lead wire segment are arranged in a same layer and made of a same material.

11. The array substrate according to claim 10, wherein the third lead wire segment and the fourth lead wire segment are both located in a source-drain material layer, and the plurality of fan-out lines are located in a gate material layer.

12. The array substrate according to claim 9, wherein the third lead wire segment and the fourth lead wire segment are arranged in different layers.

13. The array substrate according to claim 12, wherein the third lead wire segment is located in a source-drain material layer, and the fourth lead wire segment and the plurality of fan-out lines are both located in a gate material layer.

14. The array substrate according to claim 1, wherein the array substrate has a display area and a non-display area at least partially surrounding the display area, the non-display area comprises a fan-out area and a test lead wire area, the plurality of fan-out lines are at least partially located in the fan-out area, and the first test lead wire is at least partially located in the test lead wire area.

15. The array substrate according to claim 14, wherein the adapter hole between the first lead wire segment and the second lead wire segment is located on a side of the second lead wire segment adjacent to the display area.

16. The array substrate according to claim 1, wherein a width of an end of at least one of the first lead wire segment and the second lead wire segment for providing the adapter hole is not less than a width of a lead wire segment portion adjacent to the end.

17. A display panel, comprising the array substrate of claim 1.

18. A display device, comprising the display panel of claim 17.

19. A method for manufacturing an array substrate, comprising:

providing a base substrate;

forming a plurality of data signal lines, a plurality of fan-out lines, and a first test lead wire on the base substrate, wherein the first test lead wire comprises a first test pad, a first lead wire segment, and a second lead wire segment, the first lead wire segment is electrically connected to at least part of the plurality of fan-out lines and arranged in a same layer as the plurality of fan-out lines, the second lead wire segment is electrically connected to the first test pad, the first lead wire segment is not electrically connected to the second lead wire segment;

forming an insulating structure on a side of the plurality of data signal lines, the plurality of fan-out lines, and the first test lead wire away from the base substrate;

forming adapter holes running through the insulating structure, at locations where the plurality of fan-out lines and the plurality of signal data lines are adjacent to each other, and at locations where the first lead wire segment and the second lead wire segment are adjacent to each other; and forming a conducting layer on a side of the insulating structure away from the base substrate, so that the conducting layer implements, through the adapter holes, lapping between the plurality of fan-out lines and the plurality of data signal lines, and lapping between the first lead wire segment and the second lead wire segment.

* * * * *